United States Patent
Kobayashi

(10) Patent No.: US 7,297,993 B2
(45) Date of Patent: Nov. 20, 2007

(54) BIPOLAR TRANSISTOR AND FABRICATION METHOD OF THE SAME

(75) Inventor: Junichiro Kobayashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/179,404

(22) Filed: Jul. 12, 2005

(65) Prior Publication Data
US 2006/0017065 A1    Jan. 26, 2006

(30) Foreign Application Priority Data
Jul. 21, 2004    (JP)    ............................. 2004-213591

(51) Int. Cl.
*H01L 29/739*    (2006.01)
(52) U.S. Cl. ............... 257/197; 257/198; 257/E29.185; 257/E29.188; 257/E29.189; 438/235; 438/309; 438/312
(58) Field of Classification Search ................ 257/197, 257/198, E29.091, E29.124, E29.185, E29.188, 257/571, 586, 587, 592, E29.189; 438/235, 438/309, 312, E21.371, 317, 350
See application file for complete search history.

(56) References Cited

U.S. PATENT DOCUMENTS 6,600,179 B2 *    7/2003    Quaglietta et al. ........... 257/197

2001/0015474 A1 *    8/2001    Blayac et al. ................ 257/565
2004/0238843 A1 *    12/2004    Sawdai et al. .............. 257/197

FOREIGN PATENT DOCUMENTS

FR    2726125 A1 *    4/1996

\* cited by examiner

*Primary Examiner*—Sue A. Purvis
*Assistant Examiner*—Benjamin Tzu-Hung Liu
(74) *Attorney, Agent, or Firm*—Sonnenschein Nath & Rosenthal LLP

(57) ABSTRACT

A bipolar transistor having a base electrode of an air bridge structure is simplified in structure and enhanced in the degree of freedom of a contact position of a base wiring line with the base electrode. The bipolar transistor has a semiconductor mesa portion having a base layer formed on an upper face thereof, and a base electrode contacts with the base layer and has a floating extension which extends from the semiconductor mesa portion to a space on the outer side with respect to the semiconductor mesa portion. The floating extension is used as a contact portion for a base wiring line to the base electrode.

5 Claims, 12 Drawing Sheets

BIPOLAR TRANSISTOR AND FABRICATION METHOD OF THE SAME

BACKGROUND OF THE INVENTION

This invention relates to a bipolar transistor suitably applied to a hetero-junction bipolar transistor and a fabrication method of the same.

A conventional hetero-junction bipolar transistor (HBT) is generally configured in such a manner as seen in FIG. 12A which is a schematic plan view and FIG. 12B which is a schematic sectional view taken along line X-X of FIG. 12A. Referring to FIGS. 12A and 12B, the hetero-junction bipolar transistor shown includes a sub collector layer 101, a collector layer 102 and a base layer 103 laminated in order on a substrate 100 made of, for example, a semi-insulating semiconductor material to form a semiconductor mesa portion BM having an upper face to which the base layer 103 is exposed. Emitter layers 104 are formed limitatively on the semiconductor mesa portion BM.

In the HBT, provision of a contact portion, through which an external wiring line for a base electrode 105 which is in ohmic contact with the base layer 103 is connected to the base electrode 105, on the semiconductor mesa portion BM increases the area of the base region and increases the capacitance between the base and the collector, and consequently deteriorates high-frequency characteristics of the transistor, that is, the characteristic frequency fT, gain and so forth of the transistor.

In order to prevent this, the base electrode 105 is extended, as seen in FIGS. 12A and 12B, to the outer side farther than the semiconductor mesa portion BM to a location on an insulating layer 106 made of, for example, SiN and formed in the form of an island on the semi-insulating semiconductor substrate. Thus, the fixed extension of the base electrode 105 on the insulating layer 106 is used as a contact portion 105C for a base wiring line.

In the configuration described, the emitter layers 104 are formed, for example, on the opposite sides of the location of the base electrode 105, and an emitter electrode 107 is formed on each of the emitter layers 104. Further, collector electrodes 108 are formed on the sub collector layer 101 on the opposite outer sides of the emitter electrodes 107.

However, where the base electrode 105 is formed in such a manner as to extend to the insulating layer 106 on the semi-insulating semiconductor substrate 100 to form the contact portion 105C as described above, there is a problem that the fabrication process therefor is much complicated and also it is difficult to control the shape the base electrode 105.

Another more simplified HBT structure has been proposed and is disclosed in Japanese Patent Laid-Open No. 2001-308312 and Technical Report of IEICE, the Institute of Electronics, Information and Communication Engineers, ED99-262. The HBT structure mentioned is shown in FIG. 13. Referring to FIG. 13, an isolation groove 210 is formed in a laminated semiconductor layer formed on a semi-insulating semiconductor substrate 200 and formed from a sub collector layer 201, a collector layer 202, a base layer 203, an emitter layer 204 and so forth. The isolation groove 210 defines a semiconductor mesa portion BM having an upper face to which the base layer 203 is exposed and an isolation portion 206 formed from part of the laminated semiconductor material separated from the semiconductor mesa portion BM. Further, a base electrode 205 is formed such that it has an extension which spans the semiconductor mesa portion BM and the isolation portion 206.

In this instance, a base wiring line contact portion 205C is a fixed extension of the base electrode 205 which is fixed to the isolation portion 206.

A collector electrode 208 is disposed on the sub collector layer 201 outside the semiconductor mesa portion BM, and an emitter electrode 207 is disposed on the emitter layer 204.

In any of the HBT described hereinabove with reference to FIGS. 12A and 12B and the HBT described above with reference to FIG. 13, the base electrode 105 or 205 has an air bridge configuration wherein it is formed such that it extends to the outer side from the semiconductor mesa portion BM and is fixed at an outer end thereof to the insulating layer 106 or the isolation portion 206 of the laminated semiconductor layer while the semiconductor layer is hollowed out below an intermediate portion of the extension so as to form an air layer.

The air layer which defines the air bridge is formed by hollowing out, after the base electrode 105 or 205 is formed, the semiconductor layer below the base electrode 105 or 205 by wet etching by which side etching of the base electrode 105 or 205 occurs.

However, in this instance, it is difficult to control the etching for the hollowing out. Further, by the etching, abnormal etching proceeds with an interface between an edge portion of the electrode and the semiconductor material, and this gives rise to such problems as deterioration of transistor characteristics, degradation of the reliability and a drop of the yield upon fabrication.

Particularly in an InP type HBT, InP is used for the substrate, and where a sub collector layer and a collector layer each formed from a semiconductor layer of an InP type which exhibits lattice matching with the InP, the side etching exhibits a high crystal selectivity. Therefore, a restriction occurs with the selection of the arrangement direction of the base electrode, and this gives rise to a restriction to the arrangement design of the base electrode. Consequently, there is a problem that the fabrication method is complicated and the yield is degraded.

Further, if the metal of the base electrode contacts at the air bridge portion with an end portion of a base mesa portion, then the stress distortion of the base metal or diffusion of the metal element reaches the semiconductor layer immediately below the same, and leak current between the base and the collector appears on a side face (end face) of the base-collector junction exposed to the side face of the mesa portion. This gives rise to a problem that there is the possibility that the reliability may be deteriorated.

Further, where a plurality of InP type HBT devices having, for example, an InGaAs layer are formed on a common substrate, since InGaAs has a small band gap, isolation of the devices cannot be achieved by application of an ordinary device isolation method by ion implantation of a neutral impurity, but it cannot be avoided to adopt the mesa structure.

SUMMARY OF THE INVENTION

It is desirable to provide a bipolar transistor which, where a base wiring line contact for a base electrode as in an InP type HBT or the like which cannot be avoided to be formed in a mesa structure is provided on an extension of the base electrode outside a base mesa portion to form an air bridge structure, is simple in configuration and high in reliability and can be fabricated with a high yield and a fabrication method of the bipolar transistor.

In order to attain the desire described above, according to an embodiment of the present invention, there is provided a bipolar transistor, having a semiconductor mesa portion having a base layer formed on an upper face thereof, and a base electrode contacting with the base layer and having a floating extension which extends from the semiconductor mesa portion to a location above a recess on the outer side with respect to the semiconductor mesa portion, the floating extension being used as a contact portion for a base wiring line to the base electrode.

The bipolar transistor may be configured such that two or more such semiconductor mesa portions are disposed in a spaced relationship by a required distance from each other, and the base electrode is provided in contact commonly with the base layers of mutually adjacent ones of the semiconductor mesa portions, the floating extension of the common base electrode extending above a recess formed between paired ones of the semiconductor mesa portions.

Preferably, the floating extension is provided on the base electrode through an upright portion which spatially rises uprightly on the inner side by a required distance with respect to a side edge of the semiconductor mesa portion on an upper face of the semiconductor mesa portion. In this instance, preferably the distance is selected to be equal to or greater than 0.5 μm from the side edge of the semiconductor mesa portion.

The bipolar transistor may be a hetero-junction bipolar transistor, an InP type hetero-junction bipolar transistor, or an InP type hetero-junction bipolar transistor having a base layer made of InGaAs or GaAsSb and a collector layer made of InGaAs or InP.

In the bipolar transistor, the base electrode which contacts with the base layer formed on the upper face of the semiconductor mesa portion has the floating extension which extends from the semiconductor mesa portion to a location above the recess on the outer side with respect to the semiconductor mesa portion, and the contact portion for a base wiring line to the base electrode is provided on the floating extension.

Where the contact portion for the wiring line to the base electrode is provided at a place other than the semiconductor mesa portion in this manner, the area of the mesa portion can be reduced when compared with that in an alternative case wherein the contact portion is provided on the mesa portion. Consequently, reduction of the junction capacitance between the base and the collector can be anticipated, and enhancement of high-frequency characteristics of the transistor, that is, the characteristic frequency $f_T$, gain and so forth of the transistor, can be anticipated.

Further, since the contact of the base wiring line to the base electrode is established in the proximity of the semiconductor mesa portion, that is, in the proximity of the contact portion of the base electrode with the base layer, the current path provided by the electrode and the wiring line is reduced in length. Consequently, reduction in resistance and parasitic capacitance can be anticipated and enhance of a frequency characteristic of the transistor can be anticipated.

Further, since the contact of the base wiring line with the base electrode can be established in the proximity of the semiconductor mesa portion in this manner, mechanical stabilization of the floating extension of the base electrode at the location can be anticipated. Consequently, the contact of the base wiring line can be established favorably.

Further, after the contact of the base wiring line is established, the holding function of the floating extension of the base electrode can be provided by the electrode base wiring line.

Further, reduction of the occupied area and simplification of the structure can be anticipated when compared with an alternative case wherein a free end of the floating extension of the base electrode is secured to a semiconductor isolation portion or an insulating layer in the form of an isle for fixation is provide specifically on a substrate and the base electrode is secured to the insulating layer as in the prior art.

Further, since the degree of freedom in arrangement position of the contact portion of the base wiring line increases, the degree of freedom in layout, for example, of the wiring line increases.

Further, where the bipolar transistor is applied, for example, as a bipolar transistor for high output power, the mechanical stabilization of the wiring line contact portion described above can be further enhanced by forming a plurality of semiconductor mesa portions each having a transistor configuration, forming a common base electrode across the semiconductor mesa portions and using an intermediate portion of the floating extension of the base electrode above a recess as the base wiring line contact portion.

Further, where the base electrode is so shaped that it rises uprightly on the inner side by a required distance with respect to an edge portion of the semiconductor mesa portion, and particularly where the distance is selected to be equal to or greater than 0.5 μm, leak current between the base and the collector on a side face (end face) of the base-collector junction exposed to the side face of the mesa portion, which is caused by stress distortion by the contact of the base electrode or diffusion of a metal element, can be prevented.

According to another embodiment of the present invention, there is provided a fabrication method of a bipolar transistor, including a semiconductor mesa portion forming step of forming a semiconductor mesa portion formed from at least a collector layer, a base layer and an emitter layer laminated on a substrate such that part of the base layer is exposed to an upper face of the semiconductor mesa portion, and a base electrode forming step of forming a base electrode which contacts with the base layer and has a floating extension which extends from the semiconductor mesa portion to a location above a recess on the outer side with respect to the semiconductor mesa portion, the base electrode forming step including a step of forming a base electrode forming support member and a base electrode metal layer patterning step, the step of forming a base electrode forming support member forming, on the base electrode forming location, the base forming support member in such a manner as to extend by a predetermined distance from a mesa side edge portion on the semiconductor mesa portion and extend into the recess of the formation location for the floating extension of the base electrode, the base electrode metal layer patterning step including a step of forming liftoff resist except the base electrode formation location, a step of forming an electrode metal layer in a region at least including a region on the base electrode formation portion, and a step of removing the liftoff resist to pattern the electrode metal layer to form the base electrode.

In the fabrication method of a bipolar transistor, a base electrode forming support member is formed at a formation location for a floating extension, and a base electrode of a predetermined pattern is formed on the base electrode forming support member by a liftoff method, and thereafter, the support member of the electrode metal is removed. Consequently, if the support member is formed from a material different from that of the semiconductor mesa portion and besides, for example, a solvent for removing the support member is selected to a material which does not erode the composing material of the semiconductor mesa portion, then the influence of the fact that the semiconductor mesa portion is eroded by side etching performed for hollowing out a lower portion of the base electrode to obtain a floating configuration upon the characteristic of the bipolar transistor can be prevented. Consequently, enhancement of the productivity and enhancement of the yield can be anticipated, and a bipolar transistor having a characteristic conforming to a designed characteristic can be formed.

Further, with the fabrication method of a bipolar transistor, the formation of the semiconductor space below the base electrode, that is, the formation of the floating portion, does not rely upon the technique of hollowing out the semiconductor by side etching. Therefore, in a bipolar transistor which cannot be avoided to have a mesa type shape as in the case of an InP type HBT, moderation of a restriction in pattern designing such as a limitation to the taking out direction of the base electrode in a case wherein the direction of the crystal axis in which side etching is liable to occur in the case of an InP type HBT is specified can be anticipated.

DETAILED DESCRIPTION OF THE PREFERRED EMBODIMENTS

A hetero-junction bipolar transistor (HBT) to which the present invention is applied is described with reference to FIGS. 1A and 1B.

Embodiment Regarding an HBT

In the present embodiment, the present invention is applied, for example, to an InP type HBT for power amplification. In particular, first and second semiconductor mesa portions BM1 and BM2 are formed in a spaced relationship by a required distance from each other on a common semi-insulating substrate 10 made of, for example, InP. In the first and second semiconductor mesa portions BM1 and BM2, a common sub collector layer 11 is formed on the semi-insulating substrate 10, and collector layers 12 and base layers 13 are successively laminated on the sub collector layer 11.

Figure 1A:
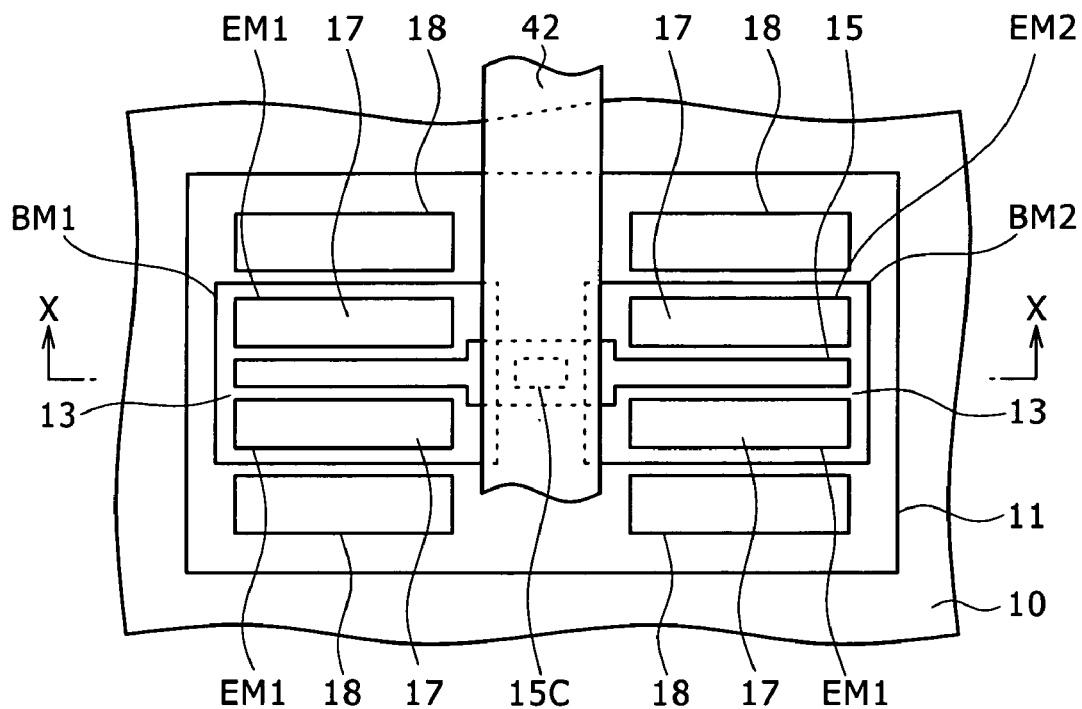
FIG. 1A is a schematic plan view of a bipolar transistor to which the present invention is applied and FIG. 1B is a schematic sectional view taken along line X-X of FIG. 1A.

The first and second semiconductor mesa portions BM1 and BM2 have first and second semiconductor mesa portions EM1 and EM2 paired with each other and provided symmetrically with respect to an X-X line of FIG. 1A. Each of the first and second semiconductor mesa portions EM1 and EM2 has emitter electrodes 17 coated in an ohmic relationship on an upper face thereof.

A pair of collector electrodes 18 are provided in contact with the sub collector layer 11 on the opposite sides of each of the first and second semiconductor mesa portions BM1 and BM2 symmetrically with respect to the X-X line.

A common base electrode 15 is disposed on the base layers 13 exposed to the upper faces of the first and second semiconductor mesa portions BM1 and BM2 such that it spans the first and second semiconductor mesa portions BM1 and BM2 along the X-X line.

The base electrode 15 is held in contact at the opposite ends thereof with the base layers 13 of the first and second semiconductor mesa portions BM1 and BM2, and a common floating extension 15F rises uprightly from the contact portions of the base electrode 15 in such a manner as to be spaced away from the upper faces of the first and second semiconductor mesa portions BM1 and BM2 and extend above a recess 40 formed between the first and second semiconductor mesa portions BM1 and BM2.

Figure 1B:
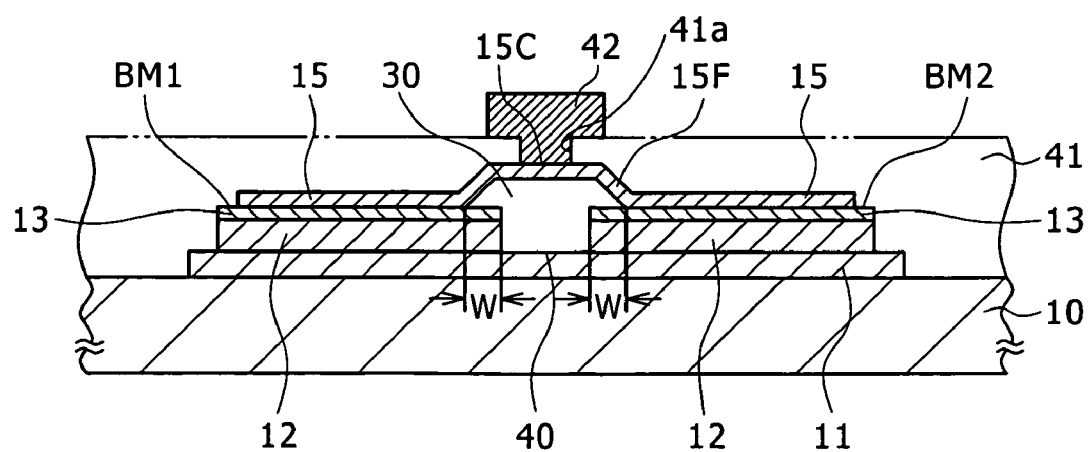

The rising positions of the base electrode 15 from the upper faces of the first and second semiconductor mesa portions BM1 and BM2 are selected such that they are displaced to the inner side, that is, to the center side, from the opposing edges of the first and second semiconductor mesa portions BM1 and BM2 so as to have a required width W as seen in FIG. 1B.

The width W is selected particularly to 0.5 µm or more.

Further, a contact portion 15C for a base wiring line with the base electrode 15 is set to the above-described floating extension 15F of the base electrode 15, and the contact portion 15C can have a required greater width as seen in FIG. 1B.

An insulating layer 41, for example, an interlayer insulating layer, is formed in such a manner as to cover the first and second semiconductor mesa portions BM1 and BM2 with which the base electrode 15 contacts in this manner.

Further, a wiring line contact opening 41a is formed by photolithography or the like on the floating extension 15F of the base electrode 15 such that a base wiring line 42 which is to contact with the base electrode 15 extends through the wiring line contact opening 41a and contacts with the contact portion 15C of the floating extension 15F of the base electrode 15.

The insulating layer 41 described above can be formed, for example, using SiN, SiO$_2$ or BCB(benzocyclobutane) and so forth. In this instance, a space 30 may remain in the recess 40 below the floating extension 15F of the base electrode 15, or the space 30 may be embedded completely or incompletely, for example, upon formation of the insulating layer 41.

Though not shown, the emitter electrodes 17 and the collector electrodes 18 contact individually with wiring lines.

Now, a fabrication method of the HBT according to the present invention is described.

Embodiment Regarding the Fabrication Method of the HBT

The InP type HBT for power amplification described above with reference to FIG. 1 is fabricated in the following manner.

Figure 2A:
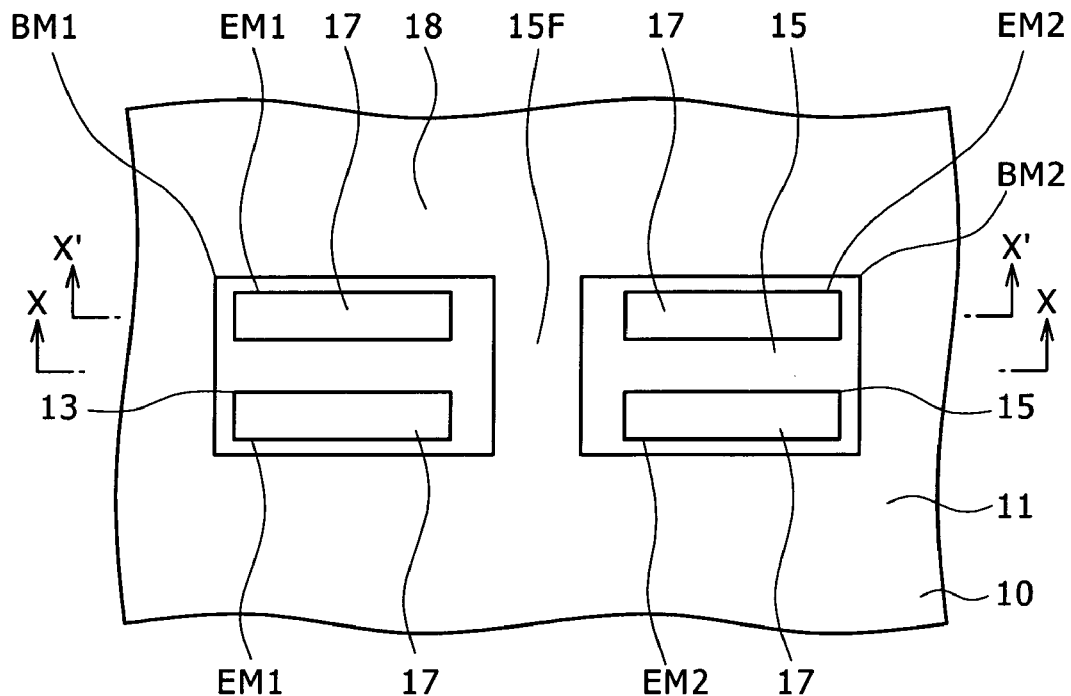
FIG. 2A is a schematic plan view illustrating a step of a fabrication method of the transistor shown in FIGS. 1A and 1B and FIGS. 2B and 2C are schematic sectional views taken along line X-X and line X'-X' of FIG. 2A, respectively.
Figure 2B:
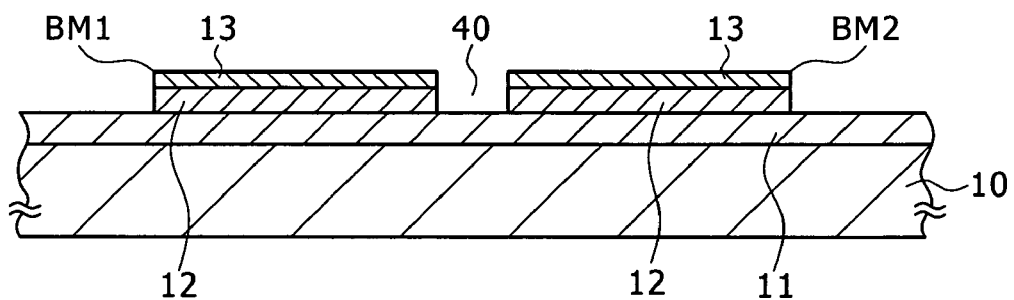
Figure 2C:
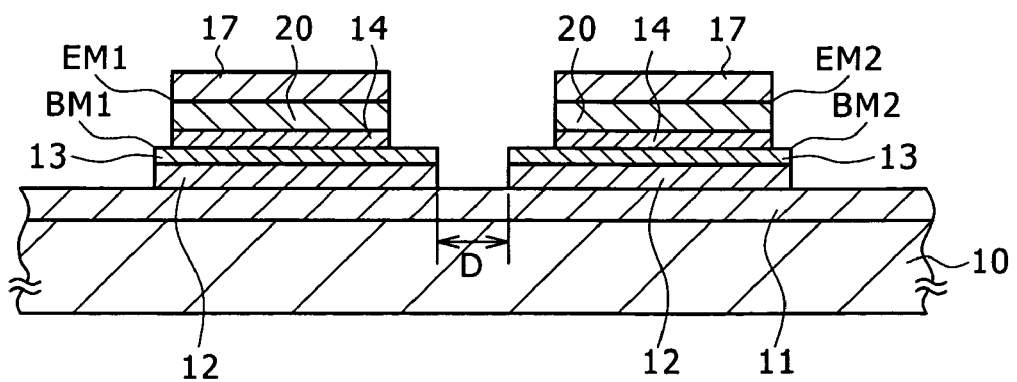

Referring first to FIGS. 2A to 2C, a semi-insulating substrate 10, for example, of InP is prepared first, and a sub collector layer 11 of InGaAs or InP of a high impurity concentration of the first conduction type such as, for example, the n type, n-type collector layers 12 of InP of approximately 500 nm thick, base layers 13 of, for example, 50 nm thick made of InGaAs of a high impurity concentration of the second conduction type, for example, the p type, emitter layers 14 of 50 nm thick made of n-type InP, and n-type emitter cap layers 20 of 150 nm thick made of, for example, InGaAs of a high concentration are successively formed once over an overall area of the substrate 10, for example, by MOCVD (Metal Organic Chemical Vapor Deposition).

Further, emitter electrodes 17 of, for example, a Ti/Pt/Au (thickness: 50/50/200 nm) structure are formed on the emitter cap layers 20 by vapor deposition, sputtering or the like.

Thereafter, a step of forming semiconductor mesa portions is performed.

At the step, mesa etching of required patterns is performed for the emitter electrodes 17, emitter cap layers 20 and emitter layers 14 successively by pattern etching by photolithography thereby to form a pair of first emitter mesa portions EM1 and a pair of second emitter mesa portions EM2. The first emitter mesa portions EM1 are disposed, for example, symmetrically with respect to the X-X line and opposed to each other, and the second emitter mesa portions EM2 are disposed symmetrically with respect to the X-X line similarly in a spaced relationship by a required distance from the first emitter mesa portions EM1 and are opposed to each other.

Further, the base layers 13 and the collector layers 12 are successively mesa-etched such that portions having the paired first emitter mesa portions EM1 and portions having the paired second emitter mesa portions EM2 may be left on the upper faces to form first and second semiconductor mesa portions BM1 and BM2 of a transistor structure in a spaced relationship by a required distance D from each other such that they are opposed to the paired first and second semiconductor mesa portions EM1 and EM2, respectively.

The first and second semiconductor mesa portions BM1 and BM2 wherein the collector layers 12 and the base layers 13 are provided in a spaced relationship by a required distance from each other on the common sub collector layer 11 and the paired first and second semiconductor mesa portions EM1 and EM2 are formed on the base layers 13 are formed in this manner.

Thus, the semiconductor mesa portions BM1 and BM2 having a collector-common transistor structure are formed on the substrate 10, and a recess 40 of the width D is defined between the semiconductor mesa portions BM1 and BM2.

Then, a step of forming a base electrode is performed.

Figure 3A:
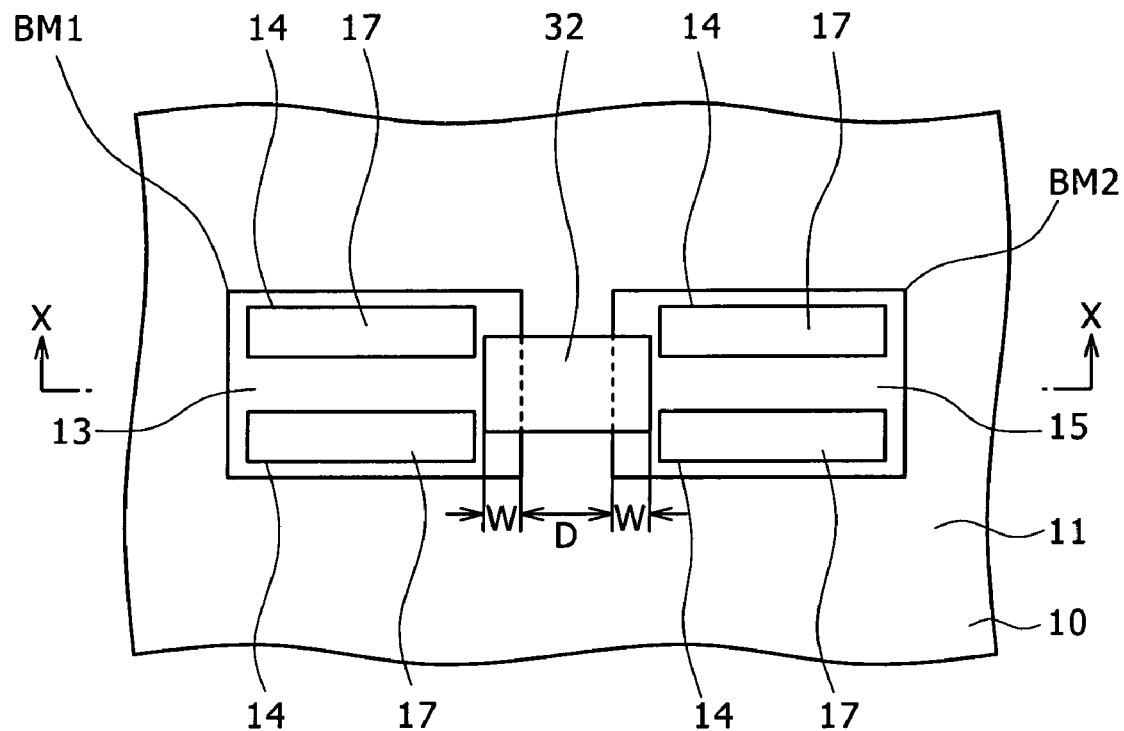
FIG. 3A is a schematic plan view illustrating another step of the fabrication method and FIG. 3B is a sectional view taken along line X-X of FIG. 3A.
Figure 3B:
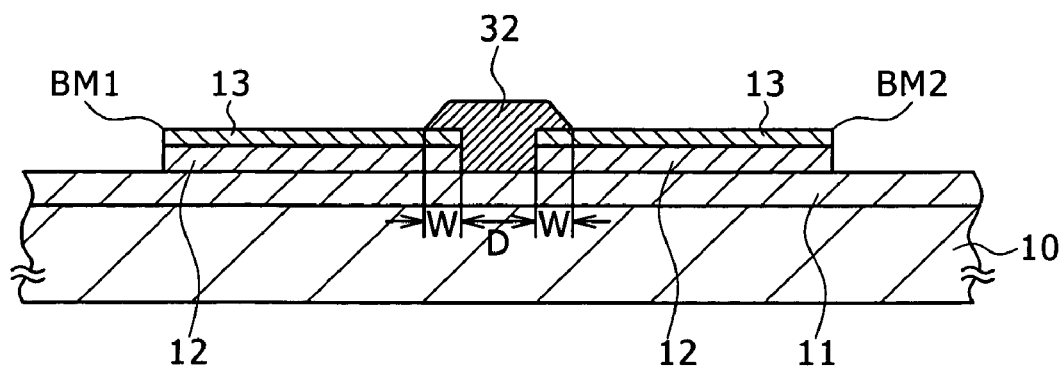
Figure 5A:
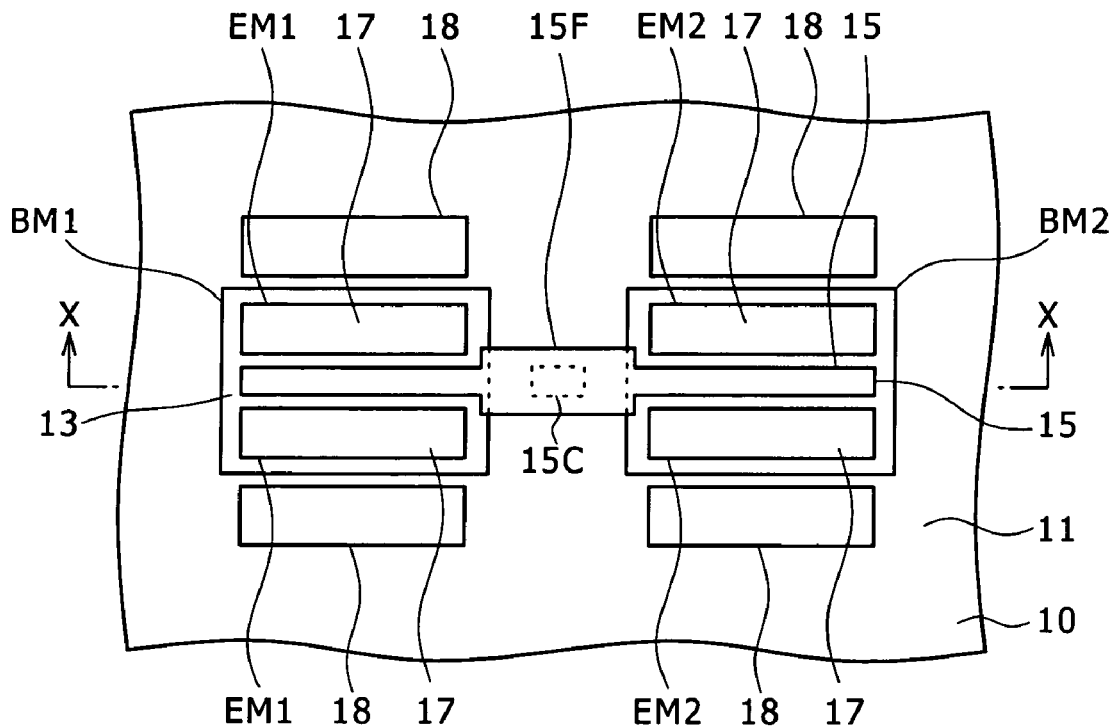
FIG. 5A is a schematic plan view illustrating a still further step of the fabrication method and FIG. 5B is a sectional view taken along line X-X of FIG. 5A.
Figure 5B:
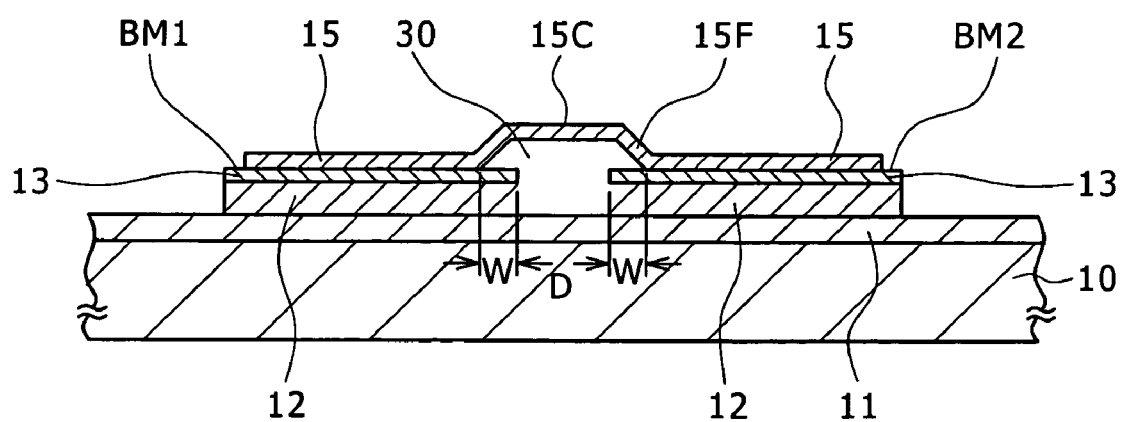

At the step, a first stage step is performed in order to form a base electrode 15 common to and extending between the two semiconductor mesa portions BM1 and BM2 as shown in FIGS. 5A and 5B such that a space 30 is formed below the base electrode 15 between the paired first and second semiconductor mesa portions EM1 and EM2 and the base electrode 15 extends along the X-X line. Particularly, as the first stage step, a base electrode forming support member 32 is filled into a concave portion formed between both of the emitter mesa portions EM1 and EM2 at the formation location of the base electrode 15 as seen in FIGS. 3A and 3B.

The base electrode forming support member 32 is formed such that it extends inwardly from edge portions of the semiconductor mesa portions BM1 and BM2 spaced by a width corresponding to 0.5 μm or more of the width W from the edge portions of the semiconductor mesa portions BM1 and BM2 shown in FIG. 1B to the rising positions of the base electrode 15 to be formed finally.

The base electrode forming support member 32 can be formed, for example, from a photoresist and has a surface having a rounded sectional shape as a result of a baking process applied thereto. Further, a hardening process by irradiation of ultraviolet rays, that is, UV cure, is performed.

Figure 4A:
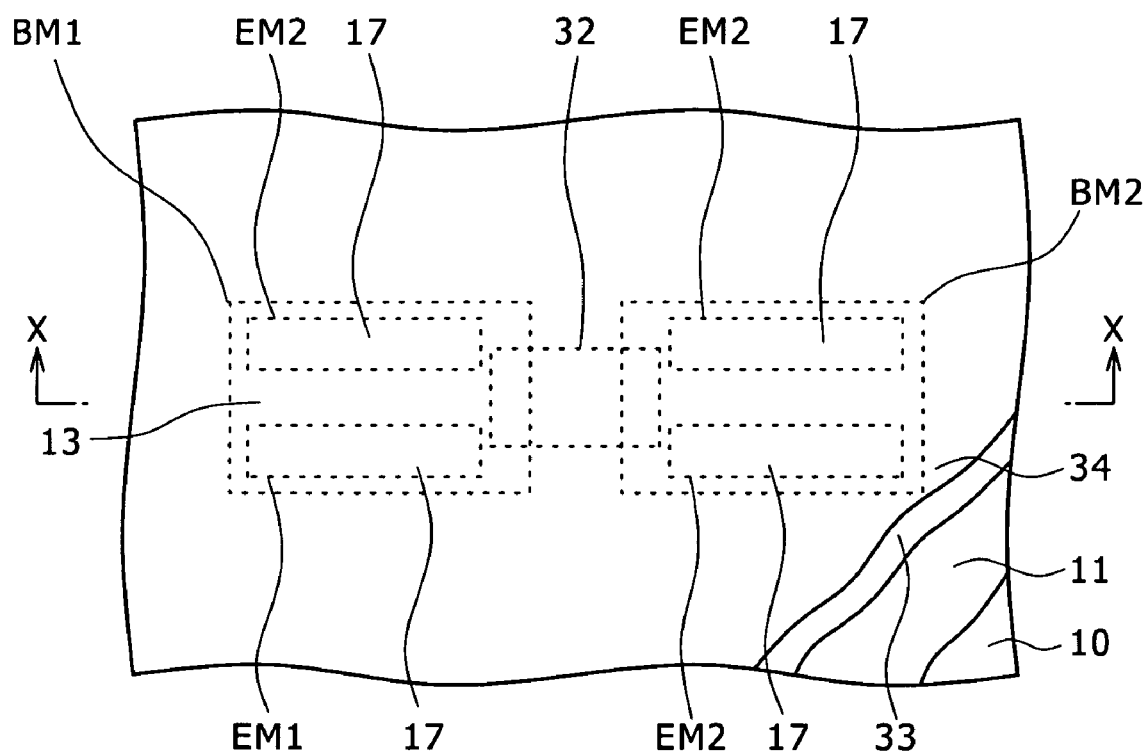
FIG. 4A is a schematic plan view illustrating a further step of the fabrication method and FIG. 4B is a sectional view taken along line X-X of FIG. 4A.
Figure 4B:
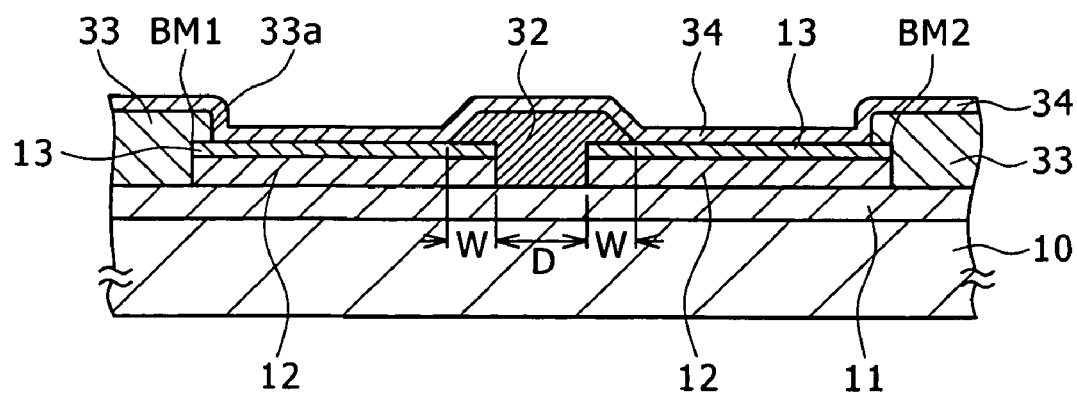

Then, a liftoff mask layer 33 having an opening 33a formed at the base electrode formation location finally is formed as seen in FIGS. 4A and 4B, and a base electrode metal layer 34 from which a base electrode is to be formed is formed over an overall area on the liftoff mask layer 33 by sputtering or the like. Upon development of the photolithography in the formation of the opening 33a, the base electrode forming support member 32 described above is prevented from being removed because of the UV cure applied thereto.

However, if the base electrode forming support member 32 is made of a material which is less likely to mix with the liftoff mask, the cure process described above is not required.

Figure 7A:
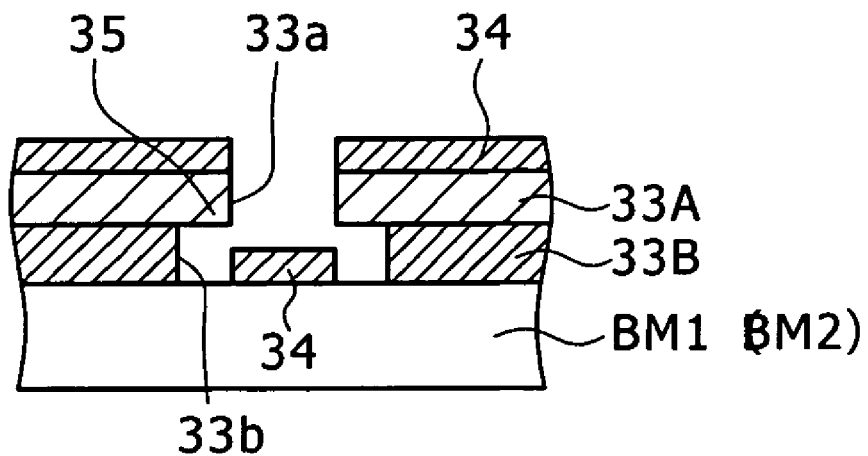
FIGS. 7A and 7B are schematic sectional views illustrating different liftoff steps of the fabrication method.

The liftoff mask layer 33 may have a double layer structure wherein a liftoff layer 33B is formed as a lower layer and a photoresist layer 33A is formed as an upper layer, for example, as seen in FIG. 7A.

Thus, an opening 33a corresponding to the pattern of an object base electrode 15 is formed in the photoresist layer 33A of the upper layer by photolithography, and in development of the photoresist layer 33A, that is, in formation of the opening 33a, side etching occurs with the liftoff layer 33B of the lower layer by the developer. Consequently, an opening 33b is formed in the liftoff layer 33B of the lower layer such that it is retracted from the circumferential edge of the opening 33a, and a visor 35 is formed above on the circumferential edge of the opening 33b by the opening 33a in the upper layer.

Accordingly, if a base electrode metal layer 34 is vapor deposited from above the mask layer 33, then a base electrode metal layer 34 is deposited directly in a pattern corresponding to the pattern of the opening 33a of the mask layer 33A of the upper layer, that is, at the formation location of the object base electrode 15, that is, at the formation locations of the base electrode 15 on the base electrode forming support member 32 and on the base layers 13 of the first and second semiconductor mesa portions BM1 and BM2.

At this time, the base electrode metal layers 34 are formed also on the mask layer 33A of the upper layer. However, the base electrode metal layer 34 on the formation location of the base electrode 15 and the base electrode metal layers 34 on the upper layer mask layer 33A are formed separately from each other.

In this state, the mask layer 33 is removed. As a result, the base electrode metal layer 34 on the liftoff mask layer 33 is removed together with the collector. In other words, the base electrode metal layer 34 is lifted off, and an object base electrode 15 is formed from the remaining base electrode metal layer 34 as seen in FIGS. 5A and 5B. At this time, also the base electrode forming support member 32 is removed, and a space 30 is formed here. Consequently, an air bridge structure is formed.

Figure 7B:
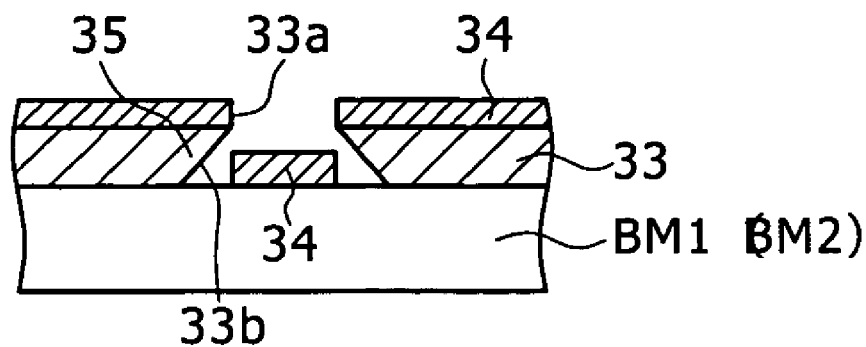

It is to be noted that such liftoff may not rely upon the double layer structure described above but may be performed using a single layer resist such as, for example, RD2000 (commodity name by Hitachi Chemical) with which a visor 35 (as shown in FIG. 7B) is generated upon development.

The base electrode metal layer 34 may be formed in a Ti/Pt/Au structure (thickness: Ti/Pt/Au~50/50/200 nm).

An air bridge structure, that is, the floating extension 15F, is formed in this manner.

Then, in the present embodiment, the floating extension 15F is used as a contact portion 15C for a wiring line to the base electrode 15. To this end, the floating extension 15F is formed with an increased width such that it has an area necessary for the contact, that is, an area of, for example, approximately 3 µm.

Further, the base electrode 15 is configured such that it rises from the positions of the first and second semiconductor mesa portions BM1 and BM2 spaced by the width W to the inner side from the opposing edges of the first and second semiconductor mesa portions BM1 and BM2. The width W is set to 0.5 µm or more.

It is to be noted that the thickness of the base electrode 15, the width of the air bridge portion, that is, the floating extension 15F, the mesa distance D and so forth are determined taking a mechanical strength required for the air bridge into consideration.

Figure 6A:
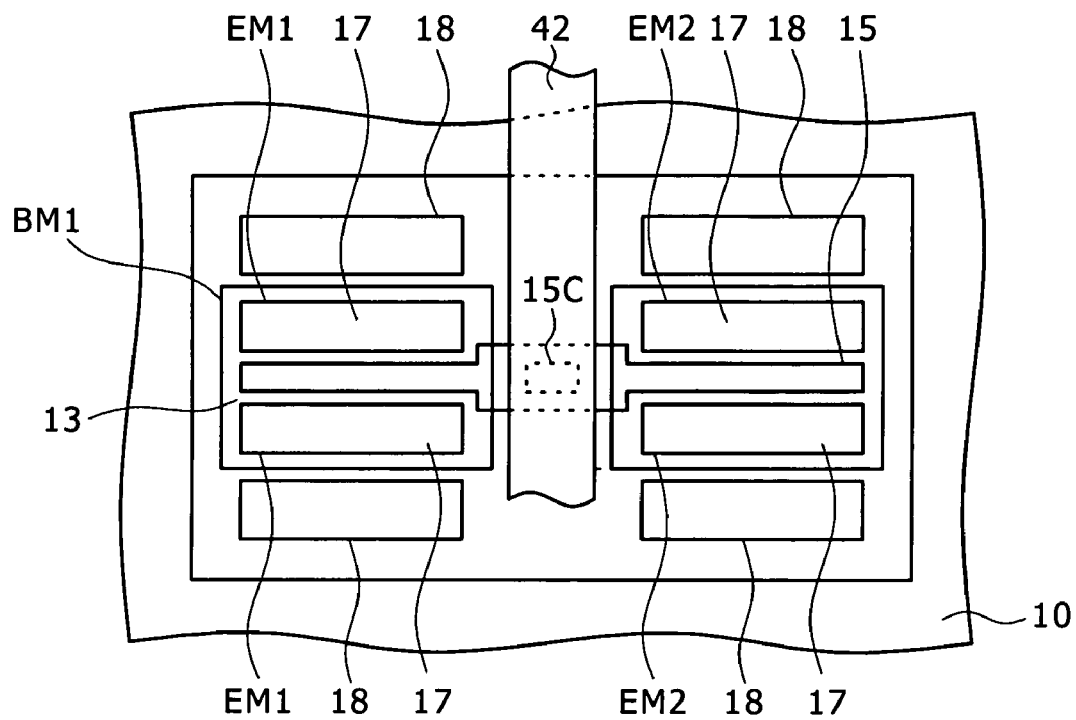
FIG. 6A is a schematic plan view illustrating a yet further step of the fabrication method and FIG. 6B is a sectional view taken along line X-X of FIG. 6A.
Figure 6B:
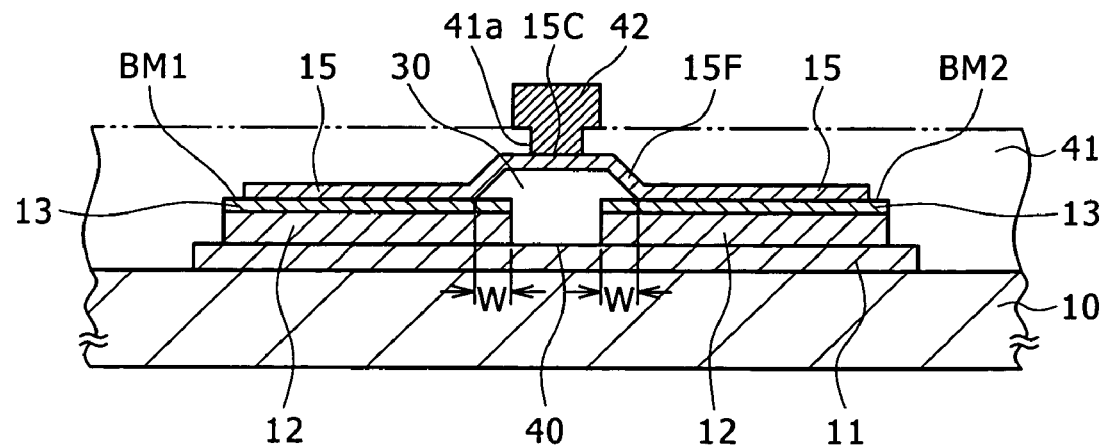

Then, collector electrodes 18 are formed in ohmic contact on the sub collector layer 11 on the opposite sides of the first and second semiconductor mesa portions BM1 and BM2 as seen in FIGS. 6A and 6B. Then, the sub collector layer 11 is etched to perform device isolation.

Thereafter, an insulating layer 41 of, for example, SiN, $SiO_2$, BCB (benzocyclobutane) or the like is formed as indicated by a chain line in FIG. 6B such that it covers over the first and second semiconductor mesa portions BM1 and BM2 with which the base electrode 15 contacts.

Then, a wiring line contact opening 41a is formed on the floating extension 15F of the base electrode 15 by photolithography or the like. Then, a base wiring line 42 to contact with the base electrode 15 extends through the wiring line contact opening 41a and contacts with the contact portion 15C of the floating extension 15F of the base electrode 15.

The insulating layer 41 described above may be formed such that a space 30 remains in the recess 40 below the floating extension 15F of the base electrode 15 or may otherwise be formed such that the space 30 is filled completely or not completely.

Further, though not shown, a multilayer wiring line structure may be used wherein a wiring layer of an upper layer is formed on the wiring layer, on which the base wiring line 42 is formed, with an interlayer insulating film interposed therebetween and the two wiring line layers are connected to each other through a contact hole perforated in the interlayer insulating layer.

As described above, in the structure of the present embodiment, where the base electrode 15 rises in a spaced relationship by the width W of 0.5 µm or more from the edge portions of the first and second semiconductor mesa portions BM1 and BM2, leak current between the collector and the base extending along side faces of the mesa portions can be improved.

Figure 8:
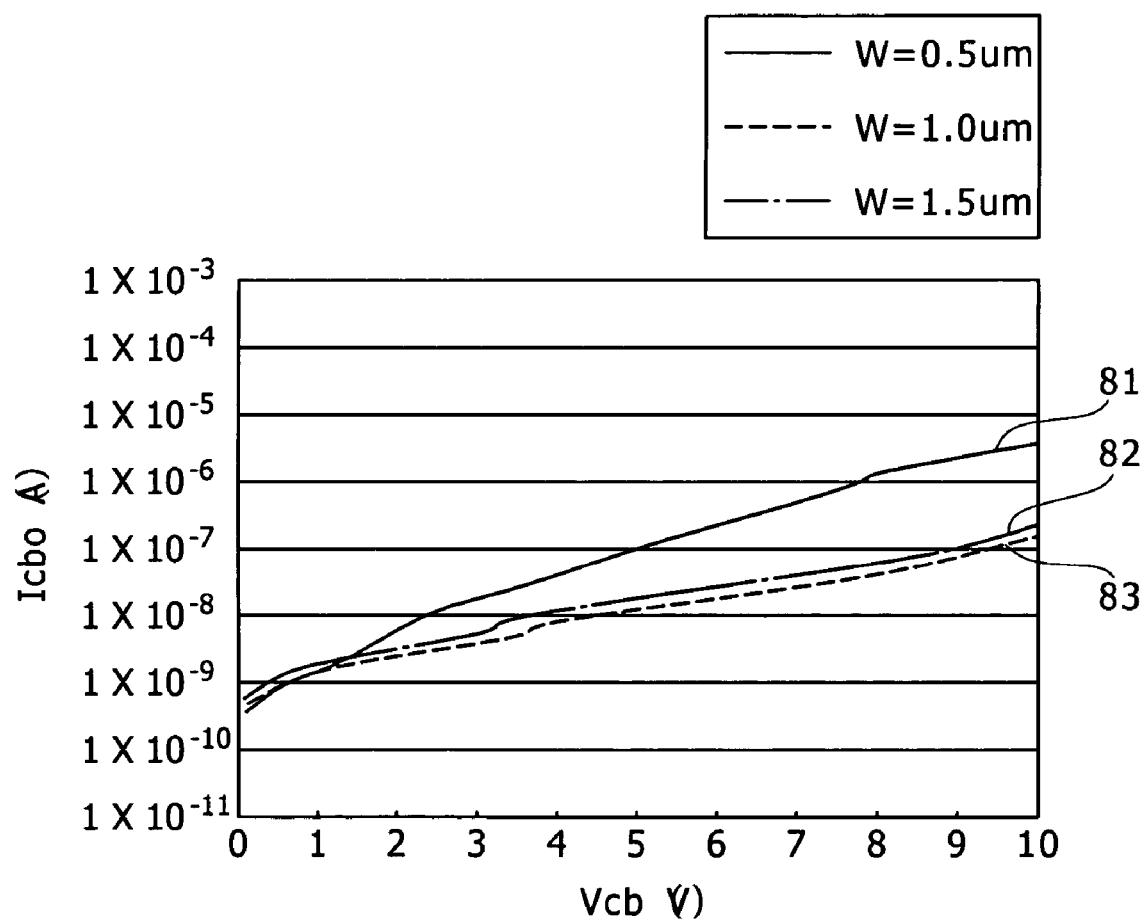
FIG. 8 is a diagram illustrating measurement curves of the dependency between the collector-base leak current and the collector-base voltage where the width of a rise portion on a mesa portion of the bipolar transistor according to the present invention from an edge portion of the mesa portion is used as a parameter.

Referring to FIG. 8, curves 81, 82 and 83 indicate results of measurement of the collector-base current Icbo with respect to the collector-base voltage Vcb when the width W is set to W=0.5 µm, 1.0 µm and 1.5 µm, respectively. As seen from the curves 81, 82 and 83, enhancement with regard to the leak current between the collector and the base can be observed where $W \geq 0.5$ µm, preferably $W \geq 1.0$ µm.

Figure 9:
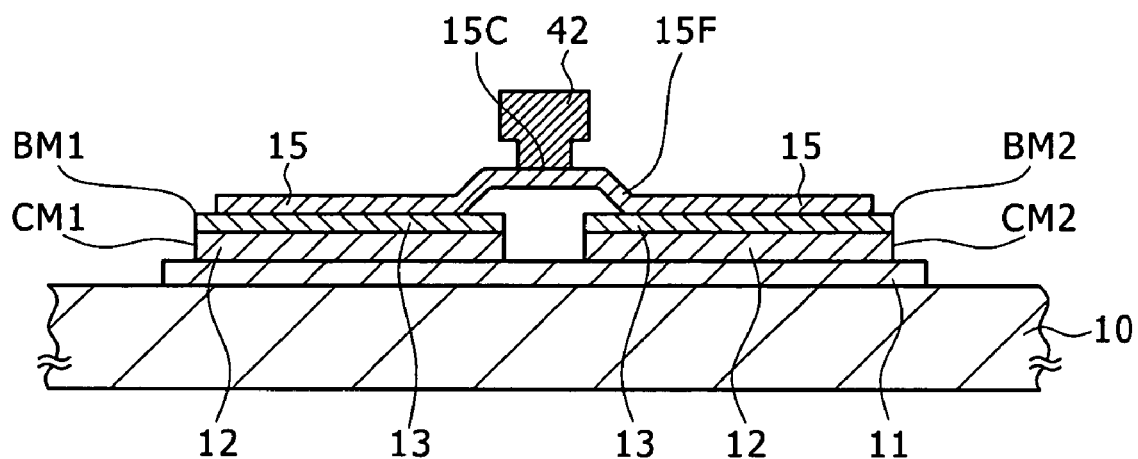
FIGS. 9 and 10 are schematic sectional views of different bipolar transistors to which the present invention is applied.

It is to be noted that the bipolar transistor and the fabrication method of the same according to the present invention are not limited to those described hereinabove but may be configured otherwise such that, for example, as seen in FIG. 9, also the collector layers 12 in the first and second semiconductor mesa portions BM1 and BM2 having a transistor structure are formed as mesa portions CM1 and CM2.

Figure 10:
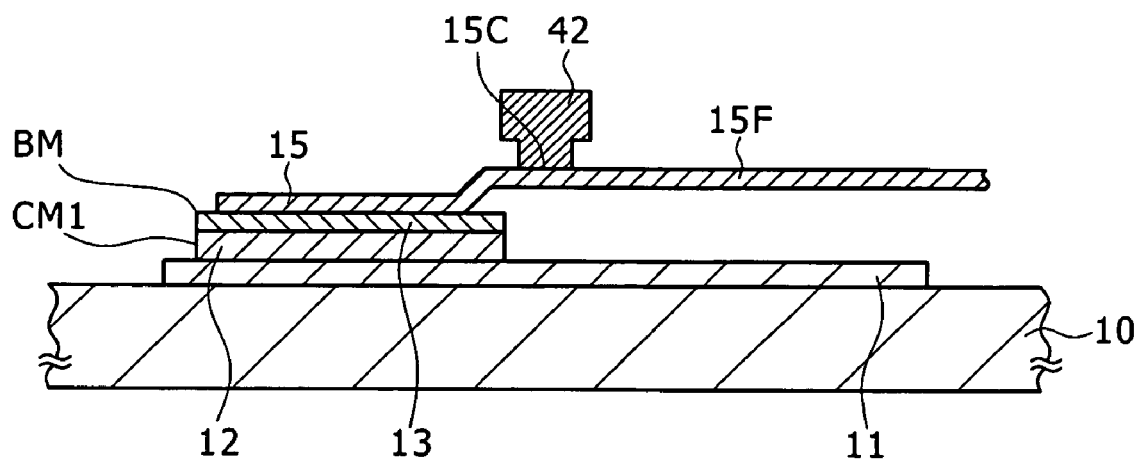

Further, while, in the embodiment described hereinabove, the base electrode 15 is formed so as to span a plurality of mesa portions, that is, the first and second semiconductor mesa portions BM1 and BM2, the base electrode 15 may be structured otherwise such that, as seen in FIG. 10, it contacts only at one end thereof with the base layer of a semiconductor mesa portion BM.

Figure 11:
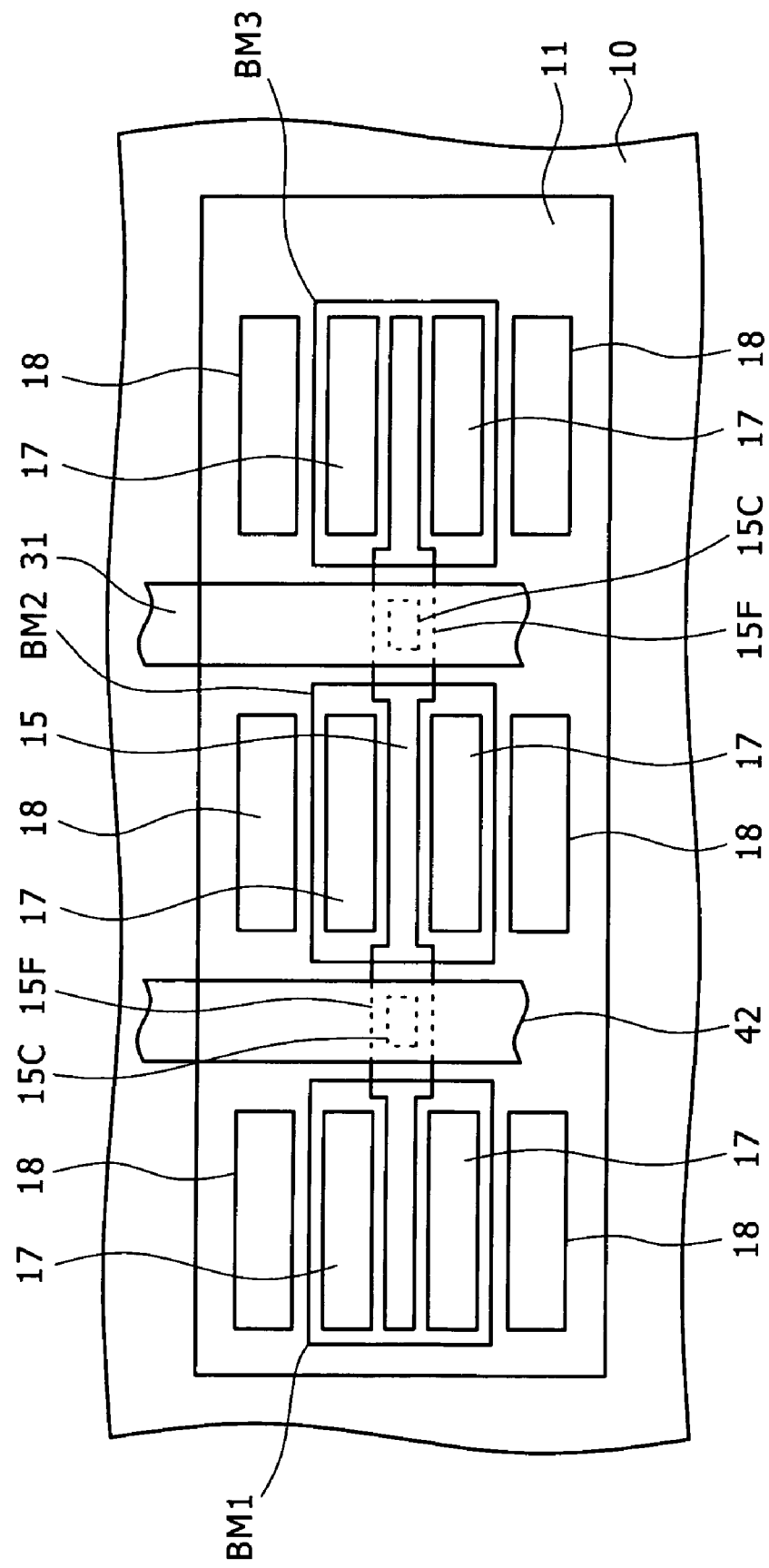
FIG. 11 is a schematic plan view of another different bipolar transistor to which the present invention is applied.
Figure 12A:
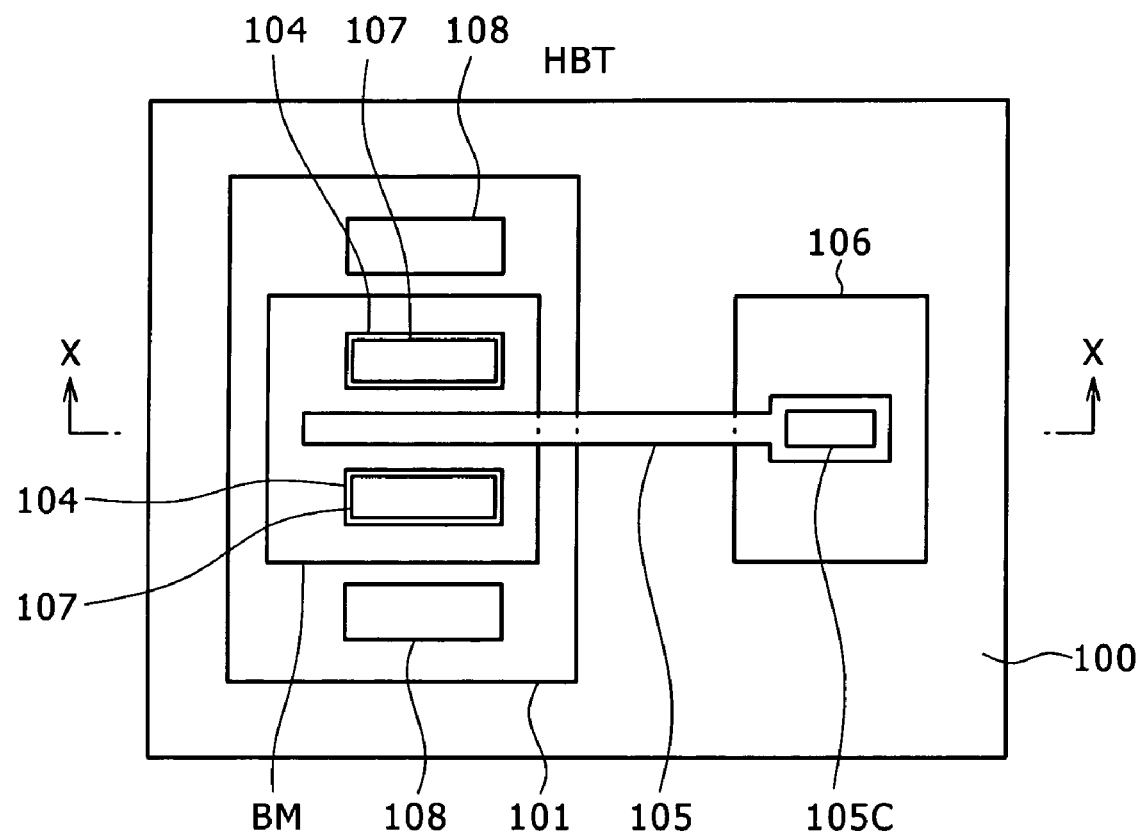
FIG. 12A is a schematic plan view of an example of a conventional bipolar transistor and FIG. 12B is a sectional view taken along line X-X of FIG. 12A.
Figure 12B:
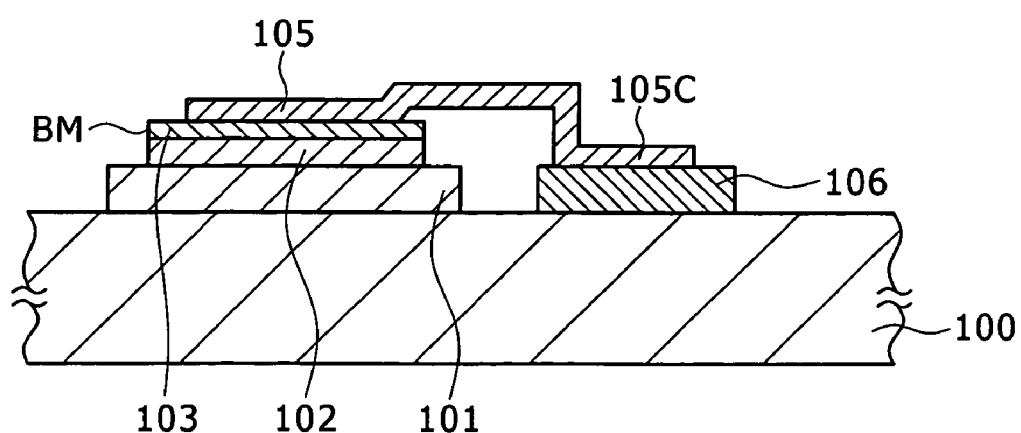
Figure 13:
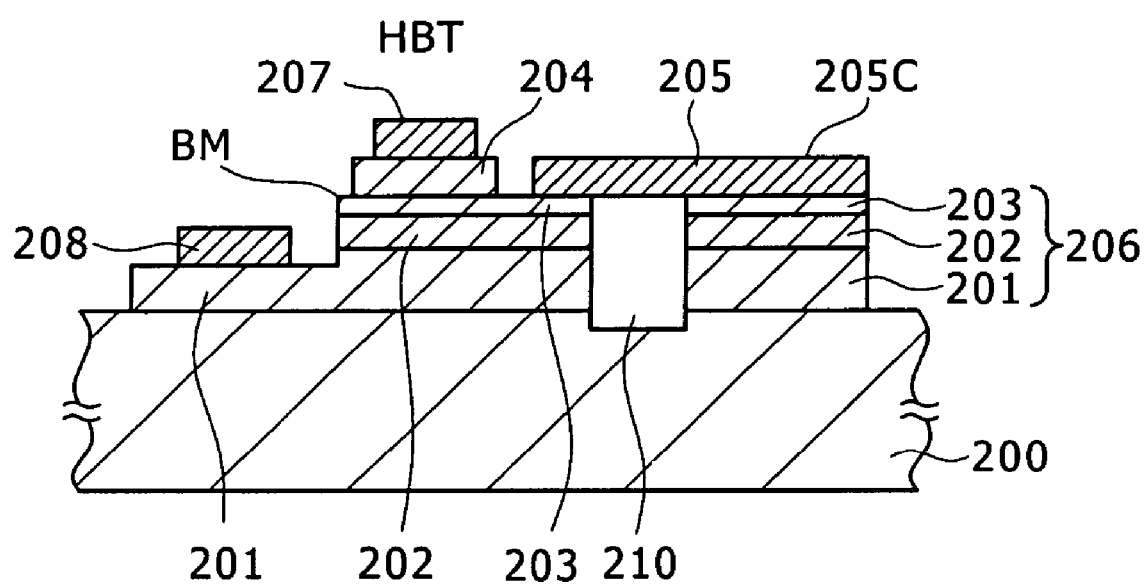
FIG. 13 is a schematic sectional view showing another example of a conventional bipolar transistor.

Further, the number of air bridge portions is not limited to one but may be any number in various arrangement configurations which include three or more semiconductor mesa portions. An example is shown in FIG. 11. Referring to FIG. 11, three semiconductor mesa portions including such first and second semiconductor mesa portions BM1 and BM2 having a transistor structure as described above and an additional third semiconductor mesa portion BM3 having a transistor structure of a similar configuration are provided. Further, a plurality of floating extensions 15F are formed between the individual semiconductor mesa portions, and a contact portion 15C for a base wiring line 42 is formed on each of the floating extensions 15F.

Further, the composition of each element in the InP type bipolar transistor described hereinabove is not limited to that of the example described hereinabove.

In particular, for example, the collector layers 12 may be formed not from InP but from InGaAs; the base layers 13 may be formed not from InGaAs but from GaAsSb; and the emitter layers 14 may be formed not from InP but from InAlAs. In this manner, various configurations are possible.

Further, the present invention can be applied also to a bipolar transistor such as an HBT of the GaAs type or the like. In this instance, the collector layer and the base layer can be formed from GaAs while the emitter layer can be formed from AlGaAs or InGaP.

Further, it is also possible to form an InP bipolar transistor of the non-lattice matching type by forming a metamorphic buffer layer of InAlAs or InP on a GaAs substrate.

As described above, according the bipolar transistor such as, for example, an HBT and the fabrication method of the same according to the present invention, the floating extension 15F is formed such that it extends from a semiconductor mesa portion to the recess 40 on the outer side of the semiconductor mesa portion, and the contact portion 15C for a base wiring line to the base electrode is provided on the floating extension 15F. By the configuration just described, since an insulating layer for fixing the electrode extension or a mesa portion is not disposed specifically except a semiconductor mesa portion which is provided in a conventional bipolar transistor. Consequently, simplification in structure and reduction in area can be achieved. Further, since the degree of freedom in arrangement position of a contact portion for a base wiring line increases, the degree of freedom in layout, for example, of a wiring line increases.

Further, since the contact for the base wiring line with the base electrode 15 is established in the proximity of a semiconductor mesa portion, that is, in the proximity of the contact portion of the base electrode with the base layer, reduction of the resistance and the parasitic capacitance incidental to the electrode and the wiring line can be anticipated, and enhancement of a frequency characteristic of the transistor can be anticipated.

Further, since the contact portion 15C for the base wiring line with the base electrode 15 can be positioned in the proximity of a semiconductor mesa portion in this manner, the mechanical stability of the floating extension 15F of the base electrode 15 at the location mentioned is high, and the contact of the base wiring line can be established favorably.

Further, after the base wiring line contact is established, the function of holding the floating extension of the base electrode can be exhibited by the electrode base wiring line.

Particularly, for example, in a bipolar transistor for high output power, the above-described mechanical stability of the wiring line contact portion can be further enhanced if a plurality of semiconductor mesa portions each having a transistor configuration are formed and a common base electrode is formed such that it spans the semiconductor mesa portions and the floating extension above each of recesses intermediately between the semiconductor mesa portions is used as a base wiring line contact portion.

Further, in the fabrication method of the present embodiment, since a method of removing a semiconductor layer below the extension of the base electrode 15 by side etching is not used, the influence of erosion of a semiconductor mesa portion on a characteristic of the bipolar transistor can be prevented. Consequently, enhancement of the productivity and enhancement of the yield can be achieved and a bipolar transistor having a characteristic conforming to a designed characteristic can be formed.

While preferred embodiments of the present invention have been described using specific terms, such description is for illustrative purposes only, and it is to be understood that changes and variations may be made without departing from the spirit or scope of the following claims.

What is claimed is:

1. A bipolar transistor, including:
   a substrate;
   at least one pair of semiconductor mesa portions provided on said substrate with a space therebetween;
   a base layer on each semiconductor mesa portion;
   a base electrode contacting and bridging between each base layer of each pair of semiconductor mesa portions; and
   a base wiring,
   wherein,
   said base layers of a semiconductor mesa portion pair are spaced from each other by a first predetermined distance,
   said base electrode extends over said first predetermined distance and forms a floating extension between said base layers,
   said floating extension includes a contact portion between said base layers where said base electrode can be connected to said base wiring over said space below said base electrode and between said corresponding mesa portions,
   said floating extension includes a portion which spatially rises uprightly above said space on an inner side by a second predetermined distance with respect to a side edge of each of said base layers, and
   said second predetermined distance is selected to be equal to or greater than 1.0 µm from said side edge of each of said base layers to decrease a leak current between a collector and said base layer.

2. The bipolar transistor according to claim 1, wherein said bipolar transistor is a hetero-junction bipolar transistor.

3. The bipolar transistor according to claim 1, wherein said bipolar transistor is an InP type heterojunction bipolar transistor.

4. The bipolar transistor according to claim 1, wherein said bipolar transistor is an InP type heterojunction bipolar transistor having a base layer made of InGaAs or GaAsSb and a collector layer made of InGaAs or InP.

5. A fabrication method of a bipolar transistor, composing:
   a semiconductor mesa portion forming step of forming a semiconductor mesa portion formed from at least a collector layer, a base layer and an emitter layer laminated on a substrate such that part of said base layer is exposed to an upper face of said semiconductor mesa portion;
   a base electrode forming step of forming a base electrode which contacts with the base layer and has a floating extension which extends from said semiconductor mesa portion to a location above a space on the outer side with respect to said semiconductor mesa portion, said floating extension being used as a contact portion for a base wiring line to said base electrode, and said base wiring positioned and contacting said floating extension spatially above the space;
   the base electrode forming step including a step of forming a base electrode forming support member and a base electrode metal layer patterning step;
   the step of forming a base electrode forming support member forming, on the base electrode forming location, the base forming support member in such a manner as to extend by a predetermined distance from a mesa side edge of the semiconductor mesa portion and extend into the space of the formation location for the floating extension of the base electrode, said predetermined distance is equal to or greater than 1.0 µm from the side edge of said semiconductor mesa portion for decreasing a leak current between a collector and the base layer; and
   the base electrode metal layer patterning step including a step of forming liftoff resist except the base electrode formation location, a step of forming an electrode metal layer in a region at least including a region on the base electrode formation portion, and a step of removing the liftoff resist to pattern the electrode metal layer to form the base electrode.

* * * * *